United States Patent [19]
Wann et al.

[11] Patent Number: 5,589,414
[45] Date of Patent: Dec. 31, 1996

[54] METHOD OF MAKING MASK ROM WITH TWO LAYER GATE ELECTRODE

[75] Inventors: Yeh-Jye Wann, Taipei; Hsien-Tsong Liu, Keelung, both of Taiwan

[73] Assignee: Taiwan Semiconductor Manufacturing Company Ltd., Hsin-Chu, Taiwan

[21] Appl. No.: 494,585

[22] Filed: Jun. 23, 1995

[51] Int. Cl.$^6$ .................................................. H01L 21/8246
[52] U.S. Cl. ............................ 437/44; 437/45; 437/48; 437/46; 437/931; 437/191
[58] Field of Search .............................. 437/44, 45, 46, 437/48, 52, 931, 191

[56] References Cited

U.S. PATENT DOCUMENTS

| | | | |
|---|---|---|---|
| 5,002,896 | 3/1991 | Naruke | 437/48 |
| 5,200,355 | 4/1993 | Choi et al. | 437/52 |
| 5,384,478 | 1/1995 | Hong | 257/385 |
| 5,429,967 | 7/1995 | Hong | 437/45 |
| 5,488,009 | 1/1996 | Hsue et al. | 437/52 |
| 5,514,610 | 5/1996 | Wann et al. | 437/45 |
| 5,514,611 | 5/1996 | Kim et al. | 437/48 |
| 5,538,914 | 7/1996 | Chiu et al. | 437/48 |

*Primary Examiner*—John Niebling
*Assistant Examiner*—Michael S. Lebentritt
*Attorney, Agent, or Firm*—George O. Saile; Graham S. Jones, II

[57] ABSTRACT

A substrate is covered with a gate oxide layer between FOX regions with a blanket lower lamina for a gate on the surface. A Mask code mask has a window overlying the desired gate location. A doped code implant region is formed in the substrate by ion implanting code implant dopant through the mask. Following mask removal a blanket upper lamina of the gate covers the lower lamina. A gate mask covers the upper and lower laminae. The gate mask is patterned to protect the gate region over the device, leaving the remainder of the upper and lower lamina exposed. Exposed surfaces of the laminae are etched away leaving a laminated gate. Lightly doped regions are formed in the substrate between the FOX regions and the gate by ion implanting dopant through portions of the gate oxide layer unprotected by the gate; forming spacers next to the gate; and forming source and drain regions in the substrate between the FOX regions and the spacers adjacent to the gate.

21 Claims, 7 Drawing Sheets

METHOD OF MAKING MASK ROM WITH TWO LAYER GATE ELECTRODE

BACKGROUND OF THE INVENTION

1. Field of the Invention

This invention relates to semiconductor memory devices and more particularly to mask ROM devices and methods of manufacture thereof.

2. Description of Related Art

U.S. Pat. No. 5,002,896 of Naruke for "Mask-ROM Manufacturing Method that Enhances Integration Density" and U.S. Pat. No. 5,200,355 of Choi et al "Method for Manufacturing a Mask-Read Only Memory Device" are references showing Mask ROM process/resulting structures, but show neither a code implant performed in a split polysilicon process nor a structure produced by such a process.

SUMMARY OF THE INVENTION

In accordance with this invention, a semiconductor device adapted for inclusion in a semiconductor memory system is formed on a semiconductor substrate covered with a gate oxide layer between field oxide regions by the following steps. A blanket lower lamina for a gate electrode is formed on the substrate surface covering the silicon dioxide and field oxide regions. The following steps include masking the device with a Mask code opening therethrough over the desired location of a gate electrode; forming a doped code implant region in the substrate by ion implanting code implant dopant through the Mask code opening into the code implant region; removing the mask; forming a blanket upper lamina of the gate electrode on the surface of the device covering the lower lamina; forming a gate mask covering the upper lamina and the lower lamina; with the gate mask patterned to protect the gate region over the device and leaving the remainder of the upper and lower lamina as exposed surfaces; etching away all exposed surfaces of the upper and lower lamina unprotected by the gate mask leaving a laminated gate electrode formed by the remainder of the lamina and the lower lamina; forming lightly doped regions in the substrate between the field oxide regions and the gate by ion implanting dopant through portions of the gate oxide layer unprotected by the gate electrode; forming dielectric spacers adjacent to the gate electrode; and forming source and drain regions in the substrate between the field oxide regions and the spacers adjacent to the gate electrode by ion implanting dopant through portions of the gate oxide layer unprotected by the spacers and the gate electrode. Preferably, the lower lamina has a thickness of less than 1,000 Å; the code implant dopant comprises phosphorus $P^{31}$ ions implanted; preferably with an energy less than 80 keV; preferably with a dose between about 5 E 13 ions/cm$^2$ and about 8 E 13 ions/cm$^2$. Preferably, the lower lamina comprises polysilicon and the upper lamina is composed of a material comprising polysilicon or a silicide selected from the group consisting of a CoSi$_2$, MoSi$_2$, TaSi$_2$, TiSi$_2$, and WSi$_2$; preferably formed by CVD followed by sintering by rapid thermal annealing at a temperature between 900° C. and 1,000° C.; and preferably doped with POCl$_3$.

In accordance with another aspect of this invention a semiconductor device adapted for inclusion in a semiconductor memory system is formed on a semiconductor substrate covered with silicon dioxide and field oxide regions. The device comprises a laminated gate electrode formed from an upper lamina and a lower lamina over a gate oxide layer. The lower lamina are formed over the gate electrode on the surface of the device between the field oxide regions. A Mask code region is ion implanted in the substrate by ion implanting code implant through the lower lamina of the gate electrode. An upper lamina of the gate electrode on the surface of the device covers the lower lamina. Lightly doped regions in the substrate between the field oxide regions and the gate formed by ion implanting dopant through portions of the gate oxide layer unprotected by the gate electrode. Dielectric spacers are adjacent to the gate electrode; and there are source and drain regions in the substrate between the field oxide regions and the spacers adjacent to the gate electrode by ion implanting dopant through portions of the gate oxide layer unprotected by the spacers and the gate electrode.

Preferably, the lower lamina has a thickness of less than 1,000 Å; the upper lamina comprises a silicide formed by CVD followed by sintering; the code implant dopant comprises phosphorus $P^{31}$ ions; which are preferably implanted with an energy less than 80 keV.

Preferably, the code implant dopant comprises phosphorus $P^{31}$ ions implanted with an energy less than 80 keV with a dose from 5 E 13 ions/cm$^2$ to 8 E 13 ions/cm$^2$; with a preferred concentration of dopant atoms of 5 E 18 atoms/cm$^3$ to 8 E 18 atoms/cm$^3$.

Preferably, the lower lamina comprises polysilicon and the upper lamina is composed of a material comprising polysilicon or a silicide selected from the group consisting of a CoSi$_2$, MoSi$_2$, TaSi$_2$, TiSi$_2$, and WSi$_2$; and preferably doped with POCl$_3$.

BRIEF DESCRIPTION OF THE DRAWINGS

The foregoing and other aspects and advantages of this invention are explained and described below with reference to the accompanying drawings, in which:

FIG. 1A shows a semiconductor device including a P– doped silicon semiconductor substrate, which has been doped and oxidized in a conventional fashion to form FOX regions between which is formed a gate oxide layer.

FIG. 1B shows the device of FIG. 1A after a blanket polysilicon layer has been formed.

FIG. 1C shows the device of FIG. 1B after the polysilicon layer has been coated with a mask patterned to form a gate electrode by etching and remaining in place during a lightly doped implant between the FOX regions and the gate electrode, forming N– doped lightly doped drain regions.

FIG. 1D shows the device of FIG. 1C after conventional spacers were formed adjacent to the side walls of the gate electrode over N– regions, followed by a conventional source/drain N+ ion implantation process forming source/drain regions between spacers and FOX regions in the substrate, leaving the lightly doped N– regions beneath the spacers between the source/drain regions and FOX regions.

FIG. 1E shows the device of FIG. 1D after the device has been coated with a photoresist mask which has been patterned to form a code implant opening over the center of gate electrode, the opening being used during a code implant of ions in the channel region between the lightly doped regions between the source/drain regions.

FIG. 1F shows the device of FIG. 1E after the mask of FIG. 1E has been stripped therefrom.

There is a problem with the process of FIGS. 1A to 1F which is that this polysilicon code implant method requires an undesirably high level of ion implant energy to penetrate through the thick polysilicon layer at an ion implantation energy level greater than about 100 keV, as a function of the thickness of the gate electrode.

FIGS. 2A–2I show a the process in accordance with this invention for forming a device with a mask ROM device by coding through ion implanting through a thin layer of polysilicon in a split polysilicon process.

Figure 2A:
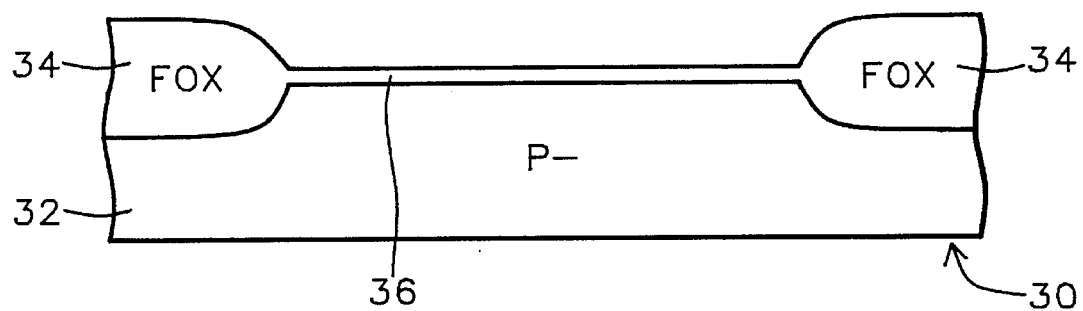

FIG. 2A shows a semiconductor device including a P– doped silicon semiconductor substrate. The device has been doped and oxidized in a conventional fashion to form FOX regions between which is formed a gate oxide layer.

Figure 2B:
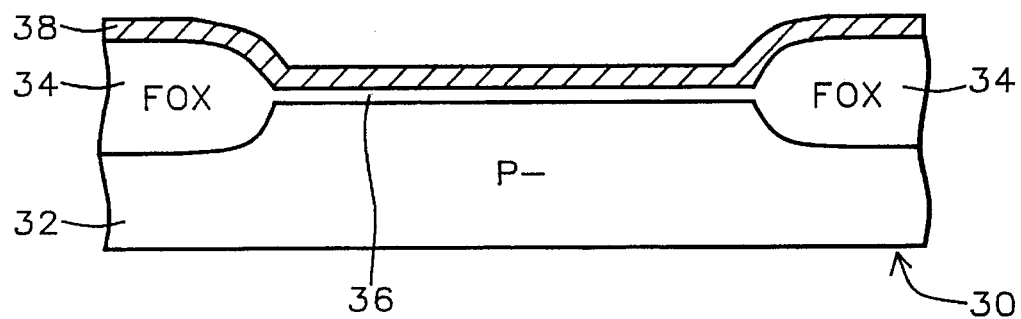

FIG. 2B shows the device of FIG. 2A after a blanket polysilicon layer has been formed having a thickness of less than 1,000 Å covering the entire surface of device including the FOX regions and the gate oxide layer.

Figure 2C:
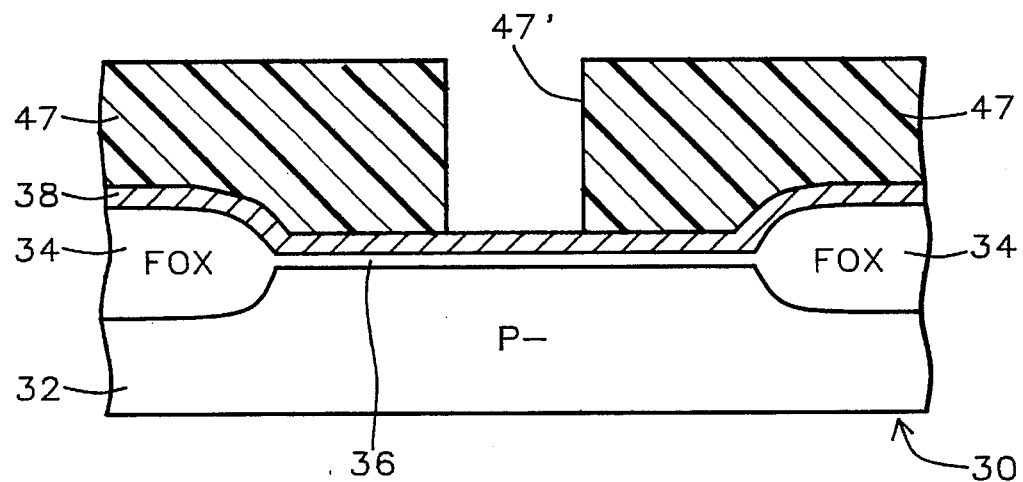

FIG. 2C shows the device of FIG. 2B after the polysilicon layer has been coated with a photoresist mask which has been patterned with a code implant opening over the center of the device.

Figure 2D:
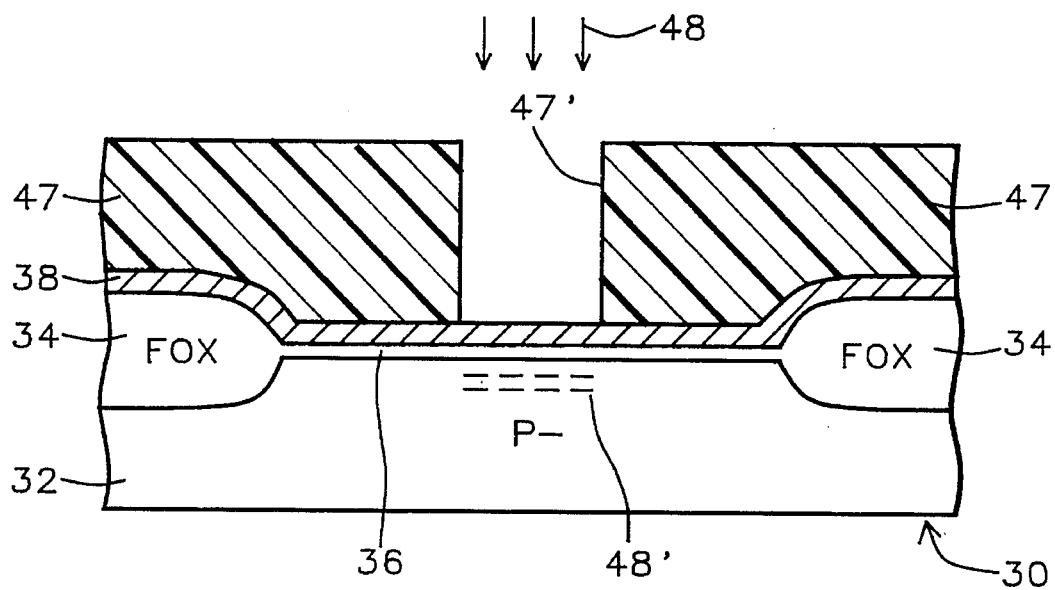

FIG. 2D shows the device of FIG. 2C after the opening in mask has been used during a code implant of ions to form a code implant region where the channel region will be formed subsequently. Ions are implanted through the polycrystalline layer having a thickness less than 1000 Å.

Figure 2E:
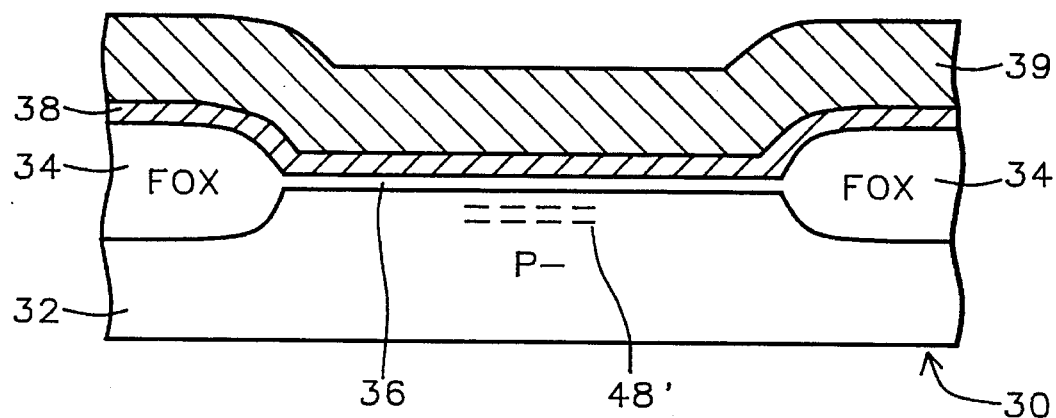
Figure 2F:
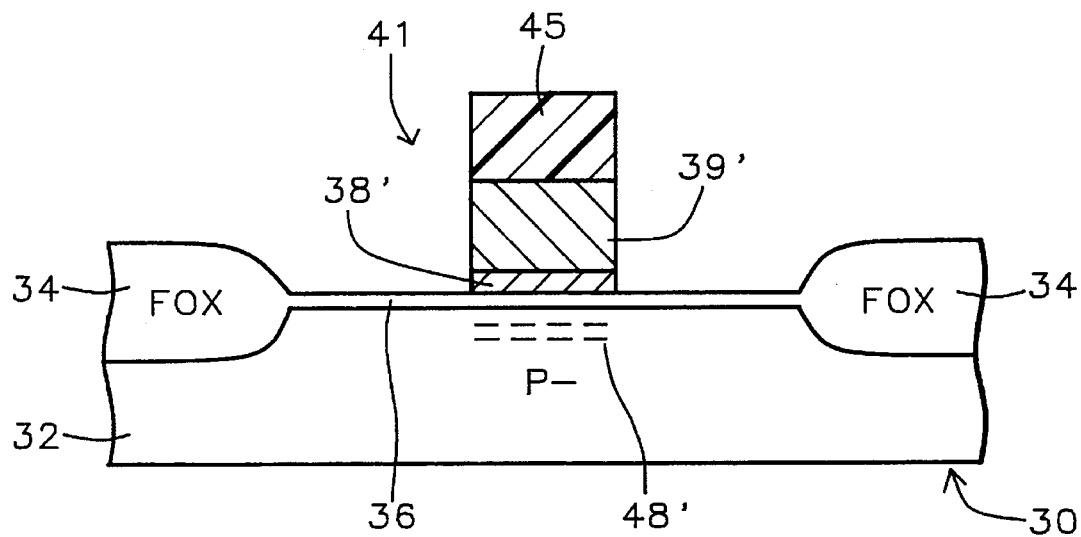

FIG. 2E shows the device of FIG. 2D after the mask has been removed and after the blanket deposition of polycrystalline silicon, upper gate electrode layer which is to be shaped along with the lower layer to form the split (laminated) gate electrode shown in FIG. 2F. Alternatively, the combination of laminated gate electrode layers can comprise polycide, where polycide is referred to as a lower layer composed of polysilicon covered with a silicide layer.

FIG. 2F shows the device of FIG. 2E after a mask has been formed over the blanket, laminated gate electrode layers which have been etched with a pattern forming the laminated gate electrode of this invention by etching through the mask.

Figure 2G:
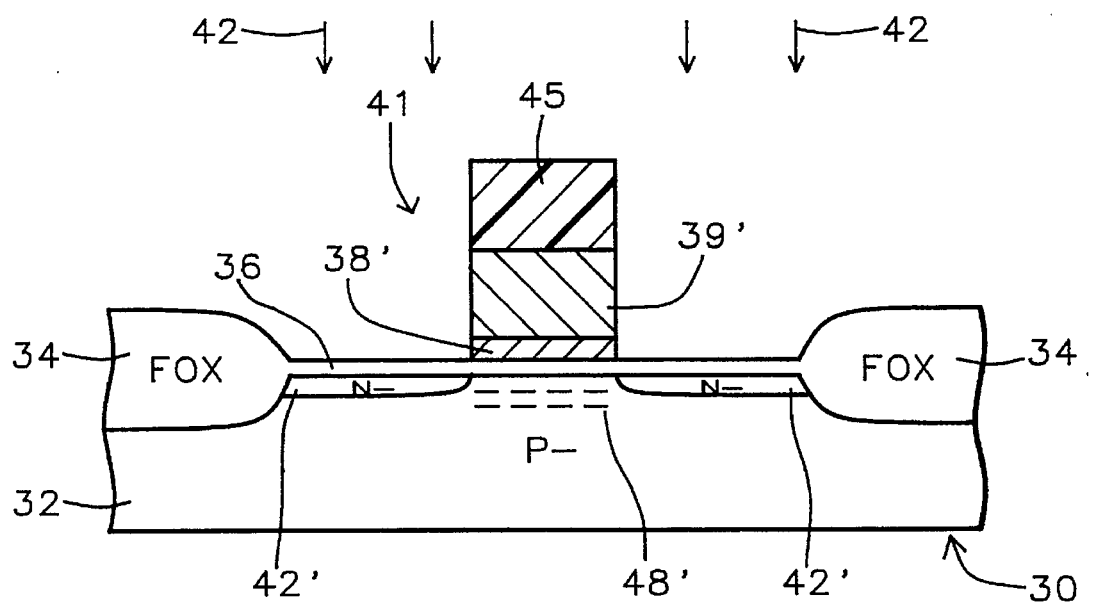

FIG. 2G shows the device of FIG. 2F with the mask remaining in place, and with a lightly doped implant of dopant being performed between the FOX regions and the gate electrode forming N– doped lightly doped drain regions.

Figure 2H:
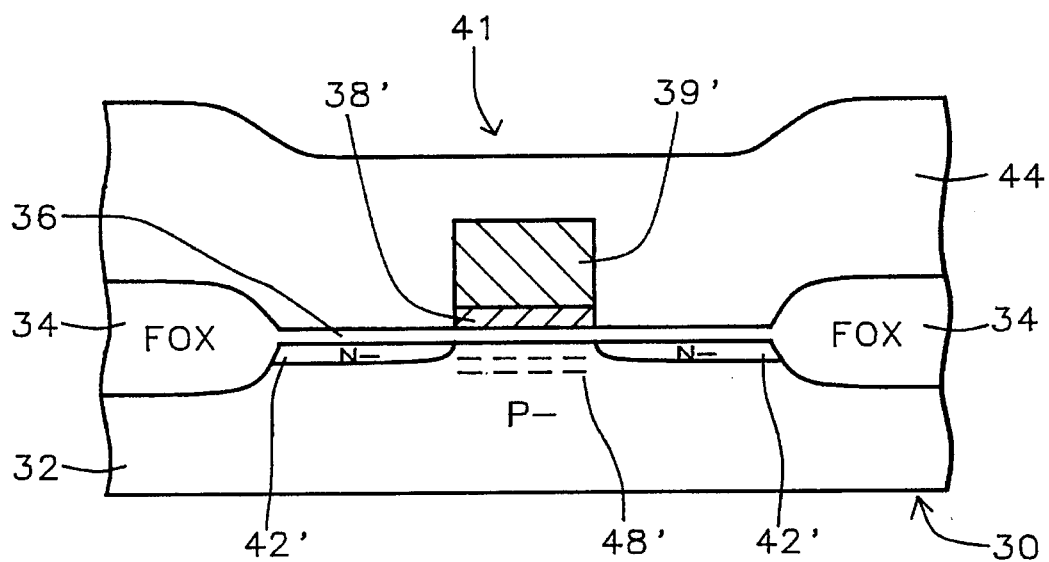

FIG. 2H shows the device of FIG. 2G after the device has been coated with a conventional blanket silicon dioxide spacer layer.

FIG. 2H shows the device of FIG. 2G after the spacer layer has been etched to form conventional spacers adjacent to the side walls of the gate electrode over N– regions.

Figure 2I:
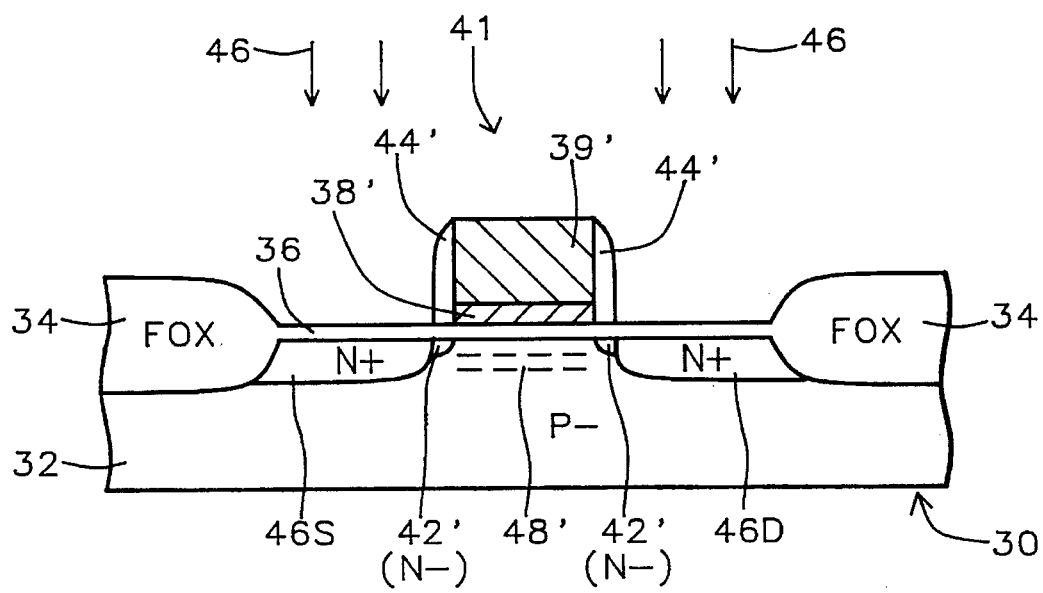

FIG. 2I shows the Mask ROM device of FIG. 2H after subjecting it to a conventional source/drain N+ ion implantation process with N ions, resulting in source/drain regions between spacers and FOX regions in the substrate, leaving the lightly doped N– regions beneath the spacers between the source/drain regions and FOX regions.

DESCRIPTION OF PROBLEM SOLVED BY THIS INVENTION

FIGS. 1A–1F shows one approach to the process of forming a device with a mask ROM device 10 through polysilicon coding.

Figure 1A:
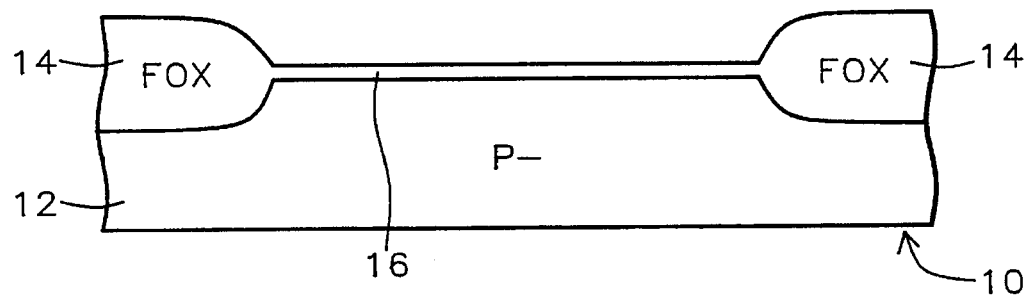
FIGS. 1A–1F shows one approach to a process of forming a device with a mask ROM device through polysilicon coding.

FIG. 1A shows a semiconductor device 10 including a P– doped silicon semiconductor substrate 12. The device 10 has been doped and oxidized in a conventional fashion to form FOX regions 14, between which is formed a gate oxide layer 16.

Figure 1B:
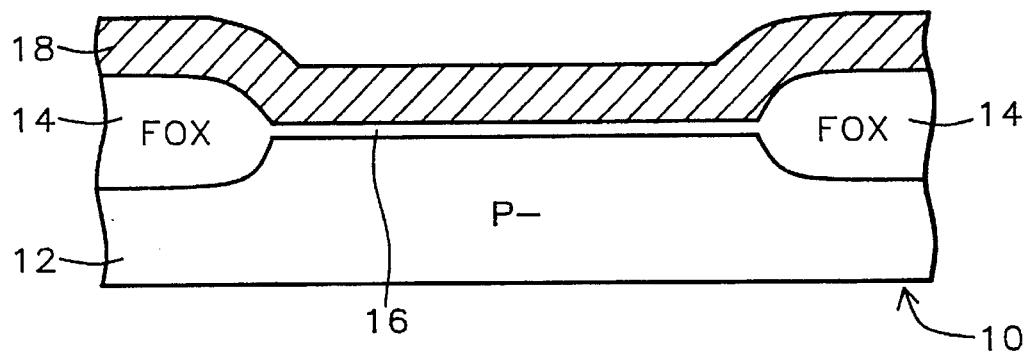

FIG. 1B shows the device 10 of FIG. 1A after a blanket polysilicon layer 18 has been formed.

Figure 1C:
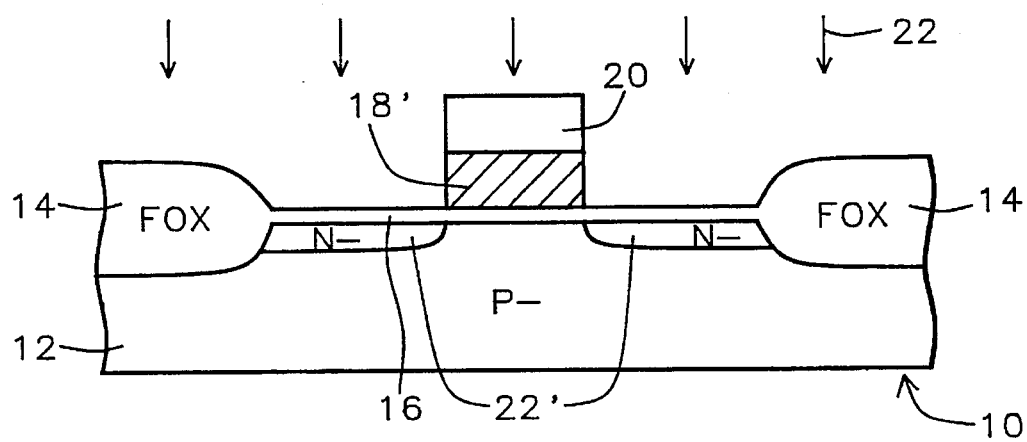

FIG. 1C shows the device 10 of FIG. 1B after the polysilicon layer 18 has been coated with a photoresist mask 20 which has been patterned to form a gate electrode from polysilicon layer 18, which mask 20 has been used to protect layer 18 during etching thereof into gate electrode 18'. Then with the mask 20 remaining in place, a lightly doped implant between the FOX regions 14 and the gate electrode 18', forming N– doped lightly doped drain regions 22'.

Figure 1D:
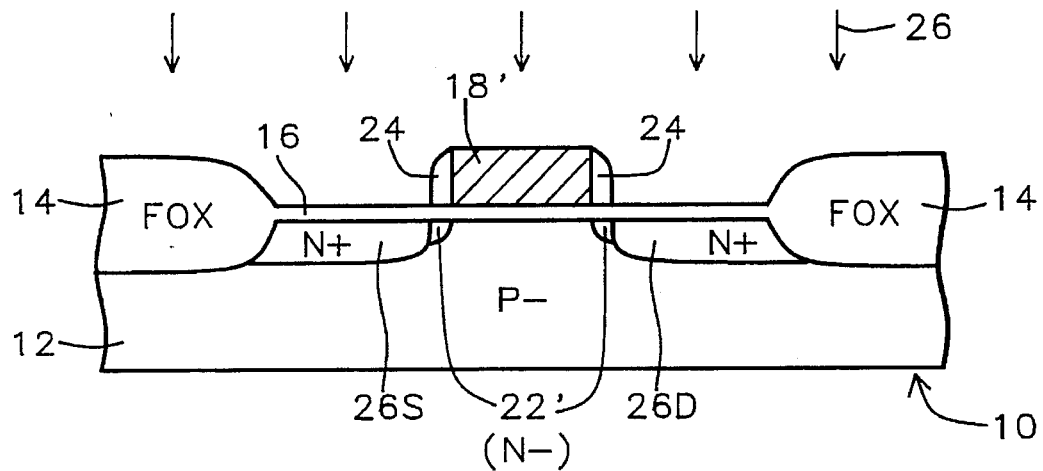

FIG. 1D shows the device 10 of FIG. 1C after the device 10 has been coated with a conventional blanket spacer layer (not shown) which has been etched to form conventional spacers 24 adjacent to the side walls of the gate electrode 18' over N– regions 22'.

Then the device 10 is subjected to a conventional source/ drain N+ ion implantation process with N ions 26 which formed source/drain regions 26S/26D between spacers 24 and FOX regions 14 in the substrate 12, leaving the lightly doped N– regions beneath the spacers 24 between the source/drain regions 26S/26D and FOX regions 14.

Figure 1E:
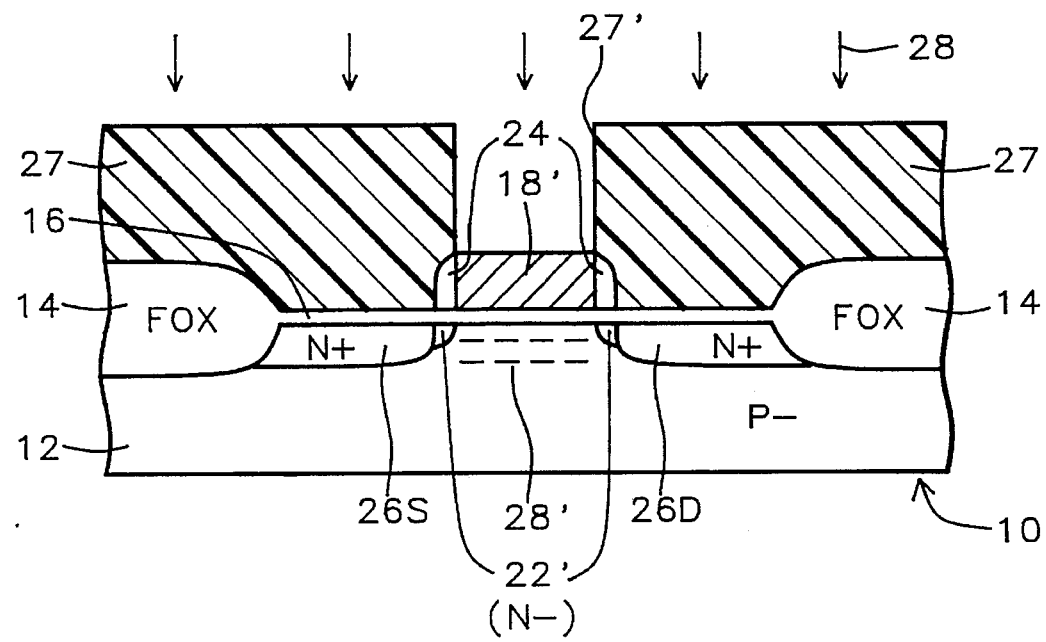

FIG. 1E shows the device 10 of FIG. 1D after the device 10 has been coated with a photoresist mask 27 which has been patterned to form a code implant opening 27' over the center of gate electrode 18'. The opening 27' in mask 27 has been used during a code implant of ions 28 to form a code implant 28' in the channel region between the lightly doped regions 28', (which lie between the source/drain regions 26S/26D.)

Figure 1F:
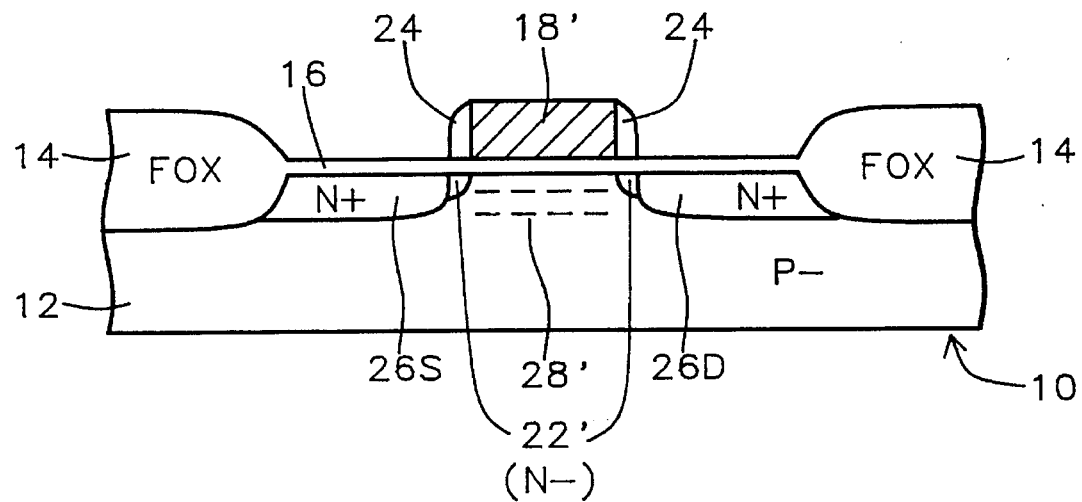

FIG. 1F shows the device 10 of FIG. 1E after the photoresist mask 27 has been stripped therefrom.

There is a problem with the process of FIGS. 1A to 1F which is that this polysilicon code implant method requires an undesirably high level of ion implant energy (about 180 keV for $P^{31}$) to penetrate through the thick 1,000 Å to about 3500 Å thick polysilicon layer 18' at an ion implantation energy level greater than about 100 keV, as a function of the thickness of the gate electrode 18'.

DESCRIPTION OF THE PREFERRED EMBODIMENT

FIGS. 2A–2I show a the process in accordance with this invention for forming a device with a mask ROM device 30 by coding through ion implanting through a layer of polysilicon.

FIG. 2A shows a semiconductor device 30 including a P– doped silicon semiconductor substrate 32. The device 30 has been doped and oxidized in a conventional fashion to form FOX regions 34 between which is formed a gate oxide layer 36 having a thickness of from 180 Å to 220 Å.

FIG. 2B shows the device 30 of FIG. 2A after a blanket first (lower) polysilicon layer 38 (Poly I) has been formed having a thickness of less than 1,000 Å covering the entire surface of device 30 including the FOX regions 34 and the gate oxide layer 36.

FIG. 2C shows the device 30 of FIG. 2B after the first (lower) polysilicon layer 38 has been coated with a photoresist mask 47 which has been patterned with a code implant opening 47' over the center of first polysilicon layer 38 above gate oxide layer 36 and between the FOX regions 34.

FIG. 2D shows the device 30 of FIG. 2C after the opening 47' in mask 47 has been used during a code implant of ions 48 to form a code implant region 48' where the channel region will be formed subsequently. Phosphorus $^{31}$ ions 48 are ion implanted through first polysilicon (polycrystalline) layer 38 having a thickness less than 1000 Å with an implant energy less than 80 keV with a dose from 5 E 13 ions/cm$^2$ to 8 E 13 ions/cm$^2$ providing a concentration of dopant atoms of 5 E 18 atoms/cm$^3$ to 8 E 18 atoms/cm$^3$.

FIG. 2E shows the device 30 of FIG. 2D after the mask 47 has been removed and after the blanket deposition of polycrystalline silicon, upper gate electrode layer 39 (Poly II,) which is laminated with the first polysilicon layer 38. The layers 39 and 38 are now ready to be shaped to form the laminated gate electrode 41 shown in FIG. 2F. Layer 39 can be composed of a polysilicon material formed by a process, such as LPCVD.

Alternatively, the combination of laminated layers 39 and 38 can comprise polycide, where polycide is referred to as a first (i.e. lower), polysilicon layer 38 formed by LPCVD covered with a silicide layer 39 formed as an upper lamina on the lower polysilicon layer 38 by chemical vapor deposition (CVD). The silicides formed on polysilicon layer 38 are selected from the group consisting of $CoSi_2$, $MoSi_2$, $TaSi_2$, $TiSi_2$, and $WSi_2$, where the group of refractory metals which may be incorporated in the silicide film comprise cobalt (Co), molybdenum (Mo), tantalum (Ta), titanium (Ti) and tungsten (W). Following the deposition by CVD, the resulting silicide is sintered in a RTA (Rapid Thermal Annealing) process at temperatures from 900° C. to 1,000° C. Such laminated structures (polycides) have the positive features that the combination of layers provides good stability, adherence, and coverage from the polysilicon as well as providing a high conductivity path from the silicide layer 39. The upper layer 39 can comprise a material selected from polysilicon and a silicide selected from the group consisting of $CoSi_2$, $MoSi_2$, $TaSi_2$, $TiSi_2$, and $WSi_2$. The gate electrode layers are doped with treatment with a source of phosphorous dopant such as liquid phosphoryl chloride $POCl_3$ added to the polysilicon by heating in a furnace.

FIG. 2F shows the device 30 of FIG. 2E after the photoresist mask 45 has been formed over blanket, laminated layers 38 and 39 which have been patterned in the form of a control gate electrode 41 of a Mask ROM FET in accordance with this process. Mask 45 is used to protect layers 39 and 38 during etching thereof to form gate electrode 41 composed of the laminated segments 38' and 39' which remain from laminated layers 38 and 39.

FIG. 2G shows the device 30 of FIG. 2F with the mask 45 remaining in place, and with a lightly doped implant of dopant 42 being performed between the FOX regions 34 and the gate electrode 41 forming N− doped lightly doped drain regions 42'.

The dopant 42 comprises P (Phosphorus) ions implanted with an energy from 45 keV to than 55 keV with a dose from 2 E 12 ions/cm$^2$ to 3 E 12 ions/cm$^2$ providing a concentration of dopant atoms of 3 E 17 atoms/cm$^3$ to 4.5 E 17 atoms/cm$^3$.

FIG. 2H shows the device 30 of FIG. 2G after the device 30 has been coated with a conventional blanket silicon dioxide spacer layer 44 deposited by a process such as LPCVD to a thickness greater than that of the gate electrode 41 to a thickness of from 2,500 to 3,000 Å.

FIG. 2H shows the device 30 of FIG. 2G after the spacer layer 44 which has been etched to form conventional spacers 44' adjacent to the side walls of the gate electrode 41 over N− regions 42'.

FIG. 2I shows the device 30 of FIG. 2H after subjecting it a conventional source/drain N+ ion implantation process with N ions 46 which formed source/drain regions 46S/46D between spacers 44' and FOX regions 34 in the substrate 32, leaving the lightly doped N− regions beneath the spacers 44' between the source/drain regions 46S/46D and FOX regions 34.

The source/drain regions 46S/46D cooperate with the gate oxide layer 36 and laminated gate electrode 41 (layers 38'/39') and all of the other elements described above to form the complete FET device 30.

The dopant 46 comprises P (Phosphorus) ions implanted with an energy from 80 keV to than 100 keV with a dose from 5 E 13 ions/cm$^2$ to 8 E 13 ions/cm$^2$ providing a concentration of dopant atoms of 5 E 18 atoms/cm$^3$ to 8 E 18 atoms/cm$^3$.

SUMMARY

Accordingly, by use of the present invention, the problem with the process of FIGS. 1A to 1F which was that this polysilicon code implant method requires an undesirably high level of ion implant energy (about 180 keV for $P^{31}$) to penetrate through the thick 1,000 Å to about 3500 Å thick polysilicon layer 39' at an ion implantation energy level greater than about 100 keV, as a function of the thickness of the gate electrode 39'.

With this changed coding method, using a split layer, i.e. laminated, gate electrode (polysilicon layer 38/polysilicon or polycide layer 39) process for coding through the first gate electrode layer (Poly I), ion implantation energy can be reduced (for $P^{31}$) with a thickness of polysilicon of about 1000 Å thick to an ion implant energy of about 80 keV. For the second gate electrode layer (Poly II) can use polysilicon or polycide.

This invention permits avoiding of 180 keV and the use of polycide in the second gate electrode layer (Poly II to produce the product of this invention with improved speed.

An additional advantage of this invention is the quicker, i.e. shorter, manufacturing cycle time.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A process of manufacture of a semiconductor device adapted for inclusion in a semiconductor memory system, formed on a semiconductor substrate covered with a gate oxide layer between field oxide regions, comprising:

forming a blanket lower lamina for a gate electrode on the surface of said gate oxide layer and said field oxide regions, forming a mask contacting said lower lamina with a mask code opening therethrough over a location for the gate electrode, forming a doped code implant region in said substrate by ion implanting code implant dopant through said Mask code opening into said code implant region, removing said mask, forming a blanket upper lamina of said gate electrode on the surface of said lower lamina, forming a gate mask over said upper lamina and said lower lamina, said gate mask patterned to protect the gate location and leaving the remainder of said upper and lower lamina as exposed surfaces, etching away all exposed surfaces of said upper and lower lamina unprotected by said gate mask leaving a laminated gate electrode formed by the remainder of said upper lamina and said lower lamina, forming lightly doped regions in said substrate between said field oxide regions and said gate by ion implanting dopant through portions of said gate oxide layer unprotected by said gate electrode, forming dielectric spacers adjacent to said gate electrode, and forming heavily doped source and drain regions in said substrate between said field oxide regions and said spacers adjacent to said gate electrode by ion implanting dopant through portions of said gate oxide layer unprotected by said spacers and said gate electrode.

2. A method in accordance with claim 1 wherein said lower lamina has a thickness of less than 1,000 Å.

3. A method in accordance with claim 1 wherein said code implant dopant comprises phosphorus $P^{31}$ ions.

4. A method in accordance with claim 1 wherein said code implant dopant comprises phosphorus $P^{31}$ ions implanted with an energy less than 80 keV.

5. A method in accordance with claim 1 wherein said code implant dopant comprises phosphorus $P^{31}$ ions implanted with an energy less than 80 keV with a dose from 5 E 13 ions/cm$^2$ to 8 E 13 ions/cm$^2$.

6. A method in accordance with claim 1 wherein said code implant dopant comprises phosphorus $P^{31}$ ions implanted with an energy less than 80 keV with a dose from 5 E 13 ions/cm$^2$ to 8 E 13 ions/cm$^2$ providing a concentration of dopant atoms between about 5 E 18 atoms/cm$^3$ and about 8 E 18 atoms/cm$^3$.

7. A method in accordance with claim 1 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$.

8. A method in accordance with claim 2 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$.

9. A method in accordance with claim 3 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$.

10. A method in accordance with claim 4 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$.

11. A method in accordance with claim 5 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$.

12. A method in accordance with claim 6 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$.

13. A method in accordance with claim 1 wherein said upper lamina is composed of a material comprising a silicide selected from the group consisting of $CoSi_2$, $MoSi_2$, $TaSi_2$, $TiSi_2$, and $WSi_2$ formed by CVD followed by sintering by rapid thermal annealing at a temperature between 900° C. and 1,000° C.

14. A method in accordance with claim 2 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$ formed by CVD followed by sintering by rapid thermal annealing at a temperature between 900° C. and 1,000° C.

15. A method in accordance with claim 3 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$ formed by CVD followed by sintering by rapid thermal annealing at a temperature between 900° C. and 1,000° C.

16. A method in accordance with claim 1 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$ formed by CVD followed by sintering by rapid thermal annealing at a temperature between 900° C. and 1,000° C. and doped with $POCl_3$.

17. A method in accordance with claim 2 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$ and doped with $POCl_3$.

18. A method in accordance with claim 3 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$ and doped with $POCl_3$.

19. A method in accordance with claim 4 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$ and doped with $POCl_3$.

20. A method in accordance with claim 5 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$ and doped with $POCl_3$.

21. A method in accordance with claim 6 wherein said lower lamina comprises polysilicon and said upper lamina is composed of a material comprising polysilicon or a silicide selected from the group consisting of $CoSi_2$, $MoSi_2$, $TaSi_2$, $TiSi_2$, and $WSi_2$ and doped with $POCl_3$.

\* \* \* \* \*